United States Patent
Granger-Jones et al.

(10) Patent No.: US 9,799,444 B2
(45) Date of Patent: Oct. 24, 2017

(54) RECONFIGURABLE DIRECTIONAL COUPLER

(71) Applicant: RF Micro Devices, Inc., Greensboro, NC (US)

(72) Inventors: Marcus Granger-Jones, Scotts Valley, CA (US); John Robert Siomkos, Greensboro, NC (US); Jeppe Korshøj Bendixen, Vrå (DK); John Avery Capwell, Greensboro, NC (US); Jayanti Jaganatha Rao, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/840,216

(22) Filed: Aug. 31, 2015

(65) Prior Publication Data

US 2016/0065167 A1    Mar. 3, 2016

Related U.S. Application Data (60) Provisional application No. 62/043,643, filed on Aug. 29, 2014.

(51) Int. Cl.
*H01P 5/18* (2006.01)
*H01F 38/14* (2006.01)
(Continued)

(52) U.S. Cl.
CPC ............ *H01F 38/14* (2013.01); *H03H 7/465* (2013.01); *H01F 21/12* (2013.01); *H01F 2038/146* (2013.01); *H03H 7/48* (2013.01)

(58) Field of Classification Search
CPC ........................................................ H01P 5/18
(Continued)

(56) References Cited

U.S. PATENT DOCUMENTS 3,611,199 A * 10/1971 Safran ............... H01P 1/185
                                               333/109
5,363,071 A    11/1994 Schwent et al.
(Continued)

OTHER PUBLICATIONS

Abdalla, M.A.Y. et al., "A Compact Highly Reconfigurable CMOS MMIC Directional Coupler," IEEE Transactions on Microwave Theory and Techniques, vol. 56, No. 2, IEEE, Feb. 2008, pp. 305-319.
(Continued)

*Primary Examiner* — Dean Takaoka
(74) *Attorney, Agent, or Firm* — Withrow & Terranova, P.L.L.C.

(57) ABSTRACT

This disclosure relates generally to directional couplers. In one embodiment, a directional coupler includes a first port, a second port, a third port, a first inductive element, a second inductive element, a first switchable path, and a second switchable path. The first inductive element is coupled between the first port and the second port, while the second inductive element is mutually coupled to the first inductive element. The first switchable path is configured to be opened and closed, wherein the first switchable path is coupled between a first location of the second inductive element and the third port. The second switchable path is configured to be opened and closed, wherein the second switchable path is coupled between a second location of the second inductive element and the third port. In this manner, a directivity of the directional coupler can be switched between a forward direction and a reverse direction.

18 Claims, 7 Drawing Sheets

(51) Int. Cl.
*H03H 7/46* (2006.01)
*H01P 1/10* (2006.01)
*H03H 7/48* (2006.01)
*H01F 21/12* (2006.01)

(58) Field of Classification Search
USPC .................................. 333/109–112, 116
See application file for complete search history.

(56) References Cited

U.S. PATENT DOCUMENTS

| | | | | |
|---|---|---|---|---|
| 6,329,880 | B2* | 12/2001 | Akiya | 330/207 P |
| 7,907,032 | B2 | 3/2011 | Yamamoto et al. | |
| 8,289,102 | B2* | 10/2012 | Yamamoto | H01P 5/184 333/116 |
| 2002/0113601 | A1* | 8/2002 | Swank, II | G01R 27/06 324/637 |
| 2014/0266499 | A1* | 9/2014 | Noe | H01P 5/04 333/111 |
| 2015/0091668 | A1* | 4/2015 | Solomko | H01P 5/18 333/109 |
| 2016/0079649 | A1* | 3/2016 | Ilkov | H04B 1/44 343/853 |
| 2016/0079650 | A1* | 3/2016 | Solomko | H03H 7/48 333/103 |
| 2016/0172738 | A1* | 6/2016 | Srirattana | H01P 5/185 333/111 |
| 2016/0172739 | A1* | 6/2016 | Srirattana | H01P 5/185 333/111 |
| 2016/0172740 | A1* | 6/2016 | Srirattana | H01P 5/185 333/111 |
| 2016/0268994 | A1* | 9/2016 | Granger-Jones | H03H 7/468 |

OTHER PUBLICATIONS

Lee, Moon-Que, "Lumped directional coupler with a varactor tuned reflector for RFID applications," IEICE Electronics Express, vol. 6, No. 2, IEICE, Jan. 25, 2009, pp. 129-134.

Marcaccioli, Luca et al., "A Novel Reconfigurable Coupler for Intelligent SOP RF Front-ends," 2005 European Microwave Conference, vol. 1, IEEE, Oct. 4-6, 2005, 4 pages.

Murray-Lasso, M.A., "Unified Matrix Theory of Lumped and Distributed Directional Couplers," The Bell System Technical Journal, vol. 47, No. 1, Jan. 1968, pp. 39-71.

Sohn, Sung-Min et al., "Tunable and High Directivity Coupler for MRI Applications," 2014 IEEE MTT-S International Microwave Symposium, IEEE, Jun. 1-6, 2014, Tampa, FL, 3 pages.

Sun, Jiwei et al., "A Highly Reconfigurable Low-Power CMOS Directional Coupler," IEEE Transactions on Microwave Theory and Techniques, vol. 60, No. 9, IEEE, Sep. 2012, pp. 2815-2822.

Vizmuller, Peter, "2.9 Directional Couplers," RF Design Guide: Systems, Circuits, and Equations, Artech House, 1995, Boston, MA, pp. 98-108.

Vogel, Ryszard W., "Analysis and Design of Lumped- and Lumped-Distributed-Element Directional Couplers for MIC and MMIC Applications," IEEE Transactions on Microwave Theory and Techniques, vol. 40, No. 2, IEEE, Feb. 1992, pp. 253-262.

Zhou, Mi et al., "A Varactor Based 90° Directional Coupler With Tunable Coupling Ratios and Reconfigurable Responses," IEEE Transactions on Microwave Theory and Techniques, vol. 62, No. 3, IEEE, Mar. 2014, pp. 416-421.

Notice of Allowance for U.S. Appl. No. 14/815,252, dated Jul. 21, 2016, 7 pages.

* cited by examiner

RECONFIGURABLE DIRECTIONAL COUPLER

RELATED APPLICATIONS

This application claims the benefit of provisional patent application Ser. No. 62/043,643, filed Aug. 29, 2014, the disclosure of which is hereby incorporated herein by reference in its entirety.

FIELD OF THE DISCLOSURE

This disclosure relates generally to directional couplers.

BACKGROUND

Directional couplers are devices that have a directivity and thus allow radio frequency (RF) signals to pass in a single direction at a time. At a coupled port, a coupled signal is generated, which allows for a power level of the RF signal to be measured. However, previous examples of directional couplers are not capable of allowing power measurements in both forward and reverse directions. Also, previous examples of directional couplers do not allow for directivity optimization, require two separate secondary windings, or require cascaded couplers. Both the cascaded approach and dual secondary designs result in increased insertion losses. Therefore, more efficient designs are needed for directional couplers that allow for both forward and reverse power measurements.

SUMMARY

This disclosure relates generally to directional couplers and related radio frequency (RF) front end circuitry. In one embodiment, a directional coupler is provided that includes a first port, a second port, a third port, a first inductive element, a second inductive element, a first switchable path, and a second switchable path. The first inductive element is coupled between the first port and the second port, while the second inductive element mutually coupled to the first inductive element. The first switchable path is configured to be opened and closed, wherein the first switchable path is coupled between a first location of the second inductive element and the third port. The second switchable path is configured to be opened and closed, wherein the second switchable path is coupled between a second location of the second inductive element and the third port. In this manner, a directivity of the directional coupler can be switched between a forward direction and a reverse direction. Thus, forward and reverse power measurements can be made with the directional coupler without additional inductive elements. Furthermore, the directional coupler can be implemented to optimize the directivity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
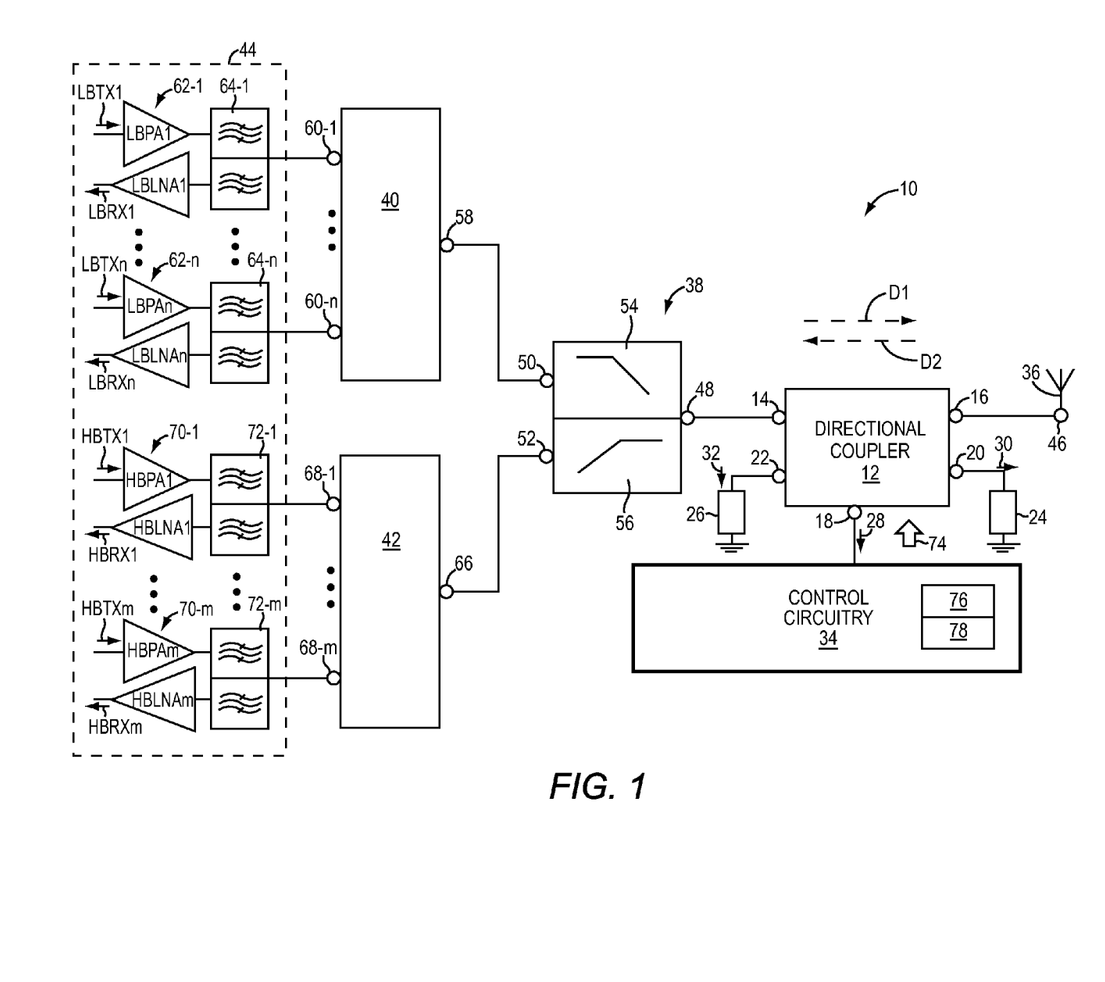
FIG. 1 illustrates exemplary radio frequency (RF) front end circuitry that includes one embodiment of a directional coupler having a directivity that is switchable between a first signal direction and a second signal direction.

FIG. 1 illustrates exemplary radio frequency (RF) front end circuitry 10 that includes one embodiment of a directional coupler 12 having a directivity that is switchable between a first signal direction D1 and a second signal direction D2. In this embodiment, the directional coupler 12 includes a first port 14, a second port 16, a third port 18, a fourth port 20, and a fifth port 22. The directional coupler 12 further includes a first variable impedance device 24 coupled to the fourth port 20 and a second variable impedance device 26 coupled to the fifth port 22. The first port 14 is a signal(s) port, and the second port 16 is another signal port. The third port 18 is a coupled port. The fourth port 20 is an isolation port, and the fifth port 22 is also an isolation port. One of these isolation ports is active and the other is inactive depending on whether the directivity of the directional coupler 12 is in the first signal direction D1 or in the second signal direction D2.

More specifically, the first signal direction D1 is from the first port 14 to the second port 16. When the directivity of the directional coupler 12 is provided in the first signal direction D1, the first port 14 operates as an input port of the directional coupler 12, and the second port 16 of the directional coupler 12 operates as an output port of the directional coupler 12. Furthermore, the fourth port 20 is provided as an activated isolation port, while the fifth port 22 is provided as a deactivated isolation port. Thus, the directional coupler 12 is configured to pass signal(s) that are directed in the first signal direction D1 from the first port 14 to the second port 16 and block signal(s) in the second signal direction D2. The second signal direction D2 is from the second port 16 to the first port 14. The directional coupler 12 is configured to generate a coupled signal 28 having a signal level set in accordance to an amount of power transmitted in the first signal direction D1 from the first port 14 to the second port 16. In this case, the fourth port 20 is the active isolation port, and the fifth port 22 is the deactivated isolation port. The first variable impedance device 24 has a first variable impedance which may be adjusted to increase the directivity in the first signal direction D1 when the directivity of the directional coupler 12 is provided in the first signal direction D1. As explained in further detail below, the directional coupler 12 is configured to generate a first compensation signal 30 that is generated from the fourth port 20 when the directivity is in the first signal direction D1, where the first variable impedance is tuned so that the first compensation signal 30 compensates for signal reflections in the second signal direction D2 when the directivity of the directional coupler 12 is in the first signal direction D1.

Additionally, the second signal direction D2 is from the second port 16 to the first port 14. When the directivity of the directional coupler 12 is provided in the second signal direction D2, the second port 16 operates as an input port of the directional coupler 12, and the first port 14 of the directional coupler 12 operates as an output port of the directional coupler 12. Furthermore, the fifth port 22 is provided as an activated isolation port, while the fourth port 20 is provided as a deactivated isolation port. Thus, the directional coupler 12 is configured to pass signal(s) that are directed in the second signal direction D2 from the second port 16 to the first port 14 and block signal(s) in the first signal direction D1 from the first port 14 to the second port 16. The directional coupler 12 is configured to generate the coupled signal 28 having the signal level set in accordance to an amount of power transmitted in the second signal direction D2 from the second port 16 to the first port 14. In this case, the fifth port 22 is the active isolation port and the fourth port 20 is the deactivated isolation port. The second variable impedance device 26 has a second variable impedance, which may be adjusted to increase the directivity in the second signal direction D2 when the directivity of the directional coupler 12 is provided in the second signal direction D2. As explained in further detail below, the directional coupler 12 is configured to generate a second compensation signal 32 that is generated from the fifth port 22 when the directivity is in the second signal direction D2, where the second variable impedance is tuned so that the second compensation signal 32 compensates for signal reflections in the first signal direction D1 when the directivity of the directional coupler 12 is in the second signal direction D2.

In this embodiment, the RF front end circuitry further includes control circuitry 34, an antenna 36, a diplexer 38, low band switching circuitry 40, high band switching circuitry 42, and RF transceiver circuitry 44. In this embodiment, the antenna 36 is connected to an antenna port 46, and the antenna port 46 is coupled to the second port 16 of the directional coupler 12. The diplexer 38 includes a common port 48, a low band port 50, and a high band port 52. The diplexer 38 has a low band filter 54 connected between the common port 48 and the low band port 50. The low band filter 54 is configured to provide a passband, which in this embodiment includes various low RF communication bands. The diplexer 38 also has a high band filter 56 connected between the common port 48 and the high band port 52. The high band filter 56 is configured to provide a passband, which in this embodiment includes various high RF communication bands. The common port 48 of the diplexer 38 is coupled to the first port 14 of the directional coupler 12.

In this manner, when the directivity of the directional coupler 12 is in the first signal direction D1, low band RF transmission signals (referred to generically as low band RF transmission signals LBTX and specifically as low band RF transmission signals LBTX1-LBTXn) within the low RF communication bands are transmitted from the low band port 50 to the common port 48, and high band RF transmission signals (referred to generically as high band RF transmission signals HBTX and specifically as high band RF transmission signals HBTX1-HBTXm) within the high RF communication bands are transmitted from the high band port 52 to the common port 48. The high band RF transmission signals HBTX and the low band RF transmission signals LBTX are referred to generically as RF transmission signals TX. As such, when the directivity of the directional coupler 12 is in the first signal direction D1, one or more of the RF transmission signals TX is passed from the first port 14 to the second port 16 of the directional coupler 12. The RF transmission signal(s) TX passed from the first port 14 to the second port 16 of the directional coupler 12 are then emitted as electromagnetic radiation from the antenna 36.

Additionally, when the directivity of the directional coupler 12 is in the second signal direction D2, low band RF receive signals (referred to generically as low band RF receive signals LBRX and specifically as low band RF receive signals LBRX1-LBRXn) within the low RF communication bands are transmitted from the common port 48 to the low band port 50, and high band RF receive signals (referred to generically as high band RF transmission signals HBRX and specifically as high band RF receive signals HBRX1-HBRXm) within the high RF communication bands are transmitted from the common port 48 to the high band port 52. The high band RF receive signals HBRX and the low band RF receive signals LBRX are referred to generically as RF receive signals RX. As such, one or more of the RF receive signals RX received by the antenna 36 are transmitted to the second port 16 of the directional coupler 12. The directional coupler 12 is configured to pass the RF receive signals RX from the second port 16 to the first port 14 when the directivity of the directional coupler 12 is in the second signal direction D2. The RF receive signal(s) RX then propagates to the common port 48 and is passed by the diplexer 38, as described above.

With respect to the low band switching circuitry 40, the low band switching circuitry 40 has a pole port 58 and throw ports (referred to generically as throw ports 60 and specifically as throw ports 60-1 through 60-$n$). The low band switching circuitry 40 is configured to selectively interconnect the pole port 58 to any one of the throw ports 60. In some embodiments, the low band switching circuitry 40 is provided as a switching network that is operable to selectively interconnect the pole port 58 to any combination of one or more of the throw ports 60.

The low band port 50 of the diplexer 38 is coupled to the low band switching circuitry 40 to receive the low band RF transmission signals LBTX from the RF transceiver circuitry 44 and to pass the low band RF receive signals LBRX from the antenna 36 to the RF transceiver circuitry 44. The high band port 52 of the diplexer 38 is coupled to the high band switching circuitry 42 to receive the high band RF transmission signals HBTX from the RF transceiver circuitry 44 and to pass the high band RF receive signals HBRX from the antenna 36 to the RF transceiver circuitry 44. The RF transceiver circuitry 44 includes low band transceiver chains (referred to generically as low band transceiver chains 62 and specifically as low band transceiver chains 62-1 through 62-$n$).

Each of the low band transceiver chains 62 is configured to generate a corresponding one of the low band RF transmission signals LBTX and process a corresponding one of the low band RF receive signals LBRX within a corresponding one of the low RF communication bands. Thus, each of the low band RF transmission signals LBTX may be generated within a transmission band of the corresponding low RF communication band. Furthermore, each of the low band RF receive signals LBRX may be provided within a receive band within the corresponding low RF communication band. Thus, each of the low band RF transmission signals LBTX has an operating frequency defined by the transmission band of the corresponding low RF communication band. For example, the low band RF transmission signal LBTX1 has an operating frequency defined by the transmission band of one of the low band RF communication bands, and the low band RF transmission signal LBTXn has an operating frequency defined by the transmission band of another low band RF communication band. Additionally, each of the low band RF receive signals LBRX has an operating frequency defined by the receive band of the corresponding low RF communication band. For instance, the low band RF receive signal LBRX1 has an operating frequency defined by the receive band of the same low band RF communication band of the low band RF transmission signal LBTX1, and the low band RF receive signal LBRXn has an operating frequency defined by the receive band of the same low band RF communication band of the low band RF transmission signal LBTXn.

Each of the throw ports 60 is coupled to a corresponding one of the low band transceiver chains 62. Furthermore, each of the low band transceiver chains 62 includes a corresponding one of a set of duplexers (referred to generically as duplexers 64 and specifically as duplexers 64-1 through 64-n). Each of the duplexers 64 is coupled to the corresponding throw port 60 and to a low band power amplifier (referred to generically as low band power amplifiers LBPA and specifically as low band power amplifiers LBPA1 through LBPAn) in a low band RF transmission chain of the corresponding low band transceiver chain 62 and to a low band low noise amplifier (referred to generically as low band low noise amplifiers LBLNA and specifically as low band low noise amplifiers LBLNA1 through LBLNAn) in a low band RF receive chain of the corresponding low band transceiver chain 62. In this manner, the corresponding low band RF transmission signal LBTX is transmitted from the low band transceiver chain 62 to the corresponding throw port 60 of the low band switching circuitry 40, and the corresponding throw port 60 of the low band switching circuitry 40 is configured to provide the corresponding low band RF receive signal LBRX to the corresponding low band transceiver chain 62.

For example, the low band power amplifier LBPA1 in the RF transmission chain of the low band transceiver chain 62-1 is configured to amplify the low band RF transmission signal LBTX1. The low band power amplifier LBPA1 is coupled to the duplexer 64-1. The duplexer 64-1 is configured to pass the low band RF transmission signal LBTX1 to the throw port 60-1 of the low band switching circuitry 40. Furthermore, the duplexer 64-1 is configured to provide the low band RF receive signal LBRX1 from the throw port 60-1 of the low band switching circuitry 40 to the low band low noise amplifier LBLNA1 in an RF receive chain of the low band transceiver chain 62-1. Also, the low band power amplifier LBPAn in an RF transmission chain of the low band transceiver chain 62-n is configured to amplify the low band RF transmission signal LBTXn. The low band power amplifier LBPAn is coupled to the duplexer 64-n. The duplexer 64-n is configured to pass the low band RF transmission signal LBTXn to the throw port 60-n of the low band switching circuitry 40-n. Furthermore, the duplexer 64-n is configured to provide the low band RF receive signal LBRXn from the throw port 60-n of the low band switching circuitry 40-n to the low band low noise amplifier LBLNA1 in an RF receive chain of the low band transceiver chain 62-n.

With respect to the high band switching circuitry 42, the high band switching circuitry 42 has a pole port 66 and throw ports (referred to generically as throw ports 68 and specifically as throw ports 68-1 through 68-m). The high band switching circuitry 42 is configured to selectively interconnect the pole port 66 to any one of the throw ports 68. In some embodiments, the high band switching circuitry 42 is provided as a switching network that is operable to selectively interconnect the pole port 66 to any combination of one or more of the throw ports 68. The RF transceiver circuitry 44 includes high band transceiver chains (referred to generically as high band transceiver chains 70 and specifically as high band transceiver chains 70-1 through 70-m).

Each of the high band transceiver chains 70 is configured to generate a corresponding one of the high band RF transmission signals HBTX and process a corresponding one of the high band RF receive signals HBRX within a corresponding one of the high RF communication bands. Thus, each of the high band RF transmission signals HBTX may be generated within a transmission band of the corresponding high RF communication band. Furthermore, each of the high band RF receive signals HBRX may be provided within a receive band within the corresponding high RF communication band. Thus, each of the high band RF transmission signals HBTX has an operating frequency defined by the transmission band of the corresponding high RF communication band. For example, the high band RF transmission signal HBTX1 has an operating frequency defined by the transmission band of one of the high band RF communication bands, and the high band RF transmission signal HBTXm has an operating frequency defined by the transmission band of another high band RF communication band. Additionally, each of the high band RF receive signals HBRX has an operating frequency defined by the receive band of the corresponding high RF communication band. For instance, the high band RF receive signal HBRX1 has an operating frequency defined by the receive band of the same high band RF communication band of the high band RF transmission signal HBTX1, and the high band RF receive signal HBRXm has an operating frequency defined by the receive band of the same high band RF communication band of the high band RF transmission signal HBTXm.

Each of the throw ports 68 is coupled to a corresponding one of the high band transceiver chains 70. Furthermore, each of the high band transceiver chains 70 includes a corresponding one of a set of duplexers (referred to generically as duplexers 72 and specifically as duplexers 72-1 through 72-m). Each of the duplexers 72 is coupled to the corresponding throw port 68 and to a high band power amplifier (referred to generically as high band power amplifiers HBPA and specifically as high band power amplifiers HBPA1 through HBPAm) in a high band RF transmission chain of the corresponding high band transceiver chain 70 and to a high band low noise amplifier (referred to generically as high band low noise amplifiers HBLNA and specifically as high band low noise amplifiers HBLNA1 through HBLNAm) in a high band RF receive chain of the corresponding high band transceiver chain 70. In this manner, the corresponding high band RF transmission signal HBTX is transmitted from the high band transceiver chain 70 to the corresponding throw port 68 of the high band switching circuitry 42, and the corresponding throw port 68 of the high band switching circuitry 42 is configured to provide the corresponding high band RF receive signal HBRX to the corresponding high band transceiver chain 70.

For example, the high band power amplifier HBPA1 in the RF transmission chain of the high band transceiver chain 70-1 is configured to amplify the high band RF transmission signal HBTX1. The high band power amplifier HBPA1 is coupled to the duplexer 72-1. The duplexer 72-1 is configured to pass the high band RF transmission signal HBTX1 to the throw port 68-1 of the high band switching circuitry 42-1. Furthermore, the duplexer 72-1 is configured to provide the high band RF receive signal HBRX1 from the throw port 68-1 of the high band switching circuitry 42-1 to the high band low noise amplifier HBLNA1 in an RF receive chain of the high band transceiver chain 70-1. Also, the high band power amplifier HBPAm in an RF transmission chain of the high band transceiver chain 70-m is configured to amplify the high band RF transmission signal HBTXm. The high band power amplifier HBPAm is coupled to the duplexer 72-m. The duplexer 72-m is configured to pass the high band RF transmission signal HBTXm to the throw port 68-1 of the high band switching circuitry 42. Furthermore, the duplexer 72-m is configured to provide the high band RF receive signal HBRXm from the throw port 68-n of the high band switching circuitry 42 to the high band low noise amplifier HBLNA1 in an RF receive chain of the high band transceiver chain 70-m.

In this manner, one or more of the RF transmission signals TX are transmitted from the RF transceiver circuitry 44 to the antenna 36 when the directivity of the directional coupler 12 is in the first signal direction D1. The signal level of the coupled signal 28 is thus set in accordance to the power level of the RF transmission signal(s) TX transmitted from the first port 14 of the directional coupler 12 to the second port 16 of the directional coupler 12. In this case, the fourth port 20 is the active isolation port, and the fifth port 22 is the deactivated isolation port. On the other hand, one or more of the RF receive signals RX are transmitted from antenna 36 to the RF transceiver circuitry when the directivity of the directional coupler 12 is in the second signal direction D2. The signal level of the coupled signal 28 is thus set in accordance to the power level of the RF receive signal(s) RX transmitted from the second port 16 of the directional coupler 12 to the first port 14 of the directional coupler 12. In this case, the fifth port 22 is the active isolation port and the fourth port 20 is the deactivated isolation port.

The control circuitry 34 is configured to control the operation of the directional coupler 12. More specifically, the control circuitry 34 is operable in a first directivity mode and a second directivity mode. The control circuitry 34 is configured to provide the directivity of the directional coupler 12 in the first signal direction D1 from the first port 14 to the second port 16 in the first directivity mode. In this manner, one or more of the RF transmission signal s TX are transmitted from the RF transceiver circuitry 44 to the antenna 36 when the control circuitry 34 is in the first directivity mode. The signal level of the coupled signal 28 is thus set in accordance to the power level of the RF transmission signal(s) TX transmitted from the first port 14 of the directional coupler 12 to the second port 16 of the directional coupler 12 when the control circuitry 34 is in the first directivity mode. In this embodiment, the first directivity mode is a forward power directivity mode.

Additionally, the control circuitry 34 is configured to provide the directivity of the directional coupler 12 in the second signal direction D2 from the second port 16 to the first port 14 in the second directivity mode. In this manner, one or more of the RF receive signals RX are transmitted from the antenna to the RF transceiver circuitry 44 when the control circuitry 34 is in the second directivity mode. The signal level of the coupled signal 28 is thus set in accordance to the power level of the RF receive signal(s) RX transmitted from the second port 16 of the directional coupler 12 to the first port 14 of the directional coupler 12 when the control circuitry 34 is in the second directivity mode. In this embodiment, the second directivity mode is a reverse power directivity mode.

To do this, the control circuitry is configured to generate a control output 74. In the first directivity mode, the control circuitry 34 is configured to obtain an operating frequency parameter 76 than indicates an RF operating frequency. The control output 74 is generated and received by the directional coupler 12 so that the directional coupler 12 provides the directivity of the directional coupler 12 in the first signal direction D1 from the first port 14 to the second port 16 in response to the control output 74. The control output 74 is also generated so as to adjust the first variable impedance of the first variable impedance device 24 in the first directivity mode. In this manner, the control circuitry 34 is configured to set the first variable impedance as a function of the operating frequency parameter 76 so that the first variable impedance substantially matches the port impedance at the fourth port 20. Additionally, in the first directivity mode, the control circuitry 34 is configured to obtain a Voltage Standing Wave Ratio (VSWR) parameter 78 that indicates VSWR. For example, the VSWR parameter 78 may indicate VSWR at the antenna port 46. The control circuitry 34 may generate the control output 74 so as to further set the first variable impedance in the first directivity mode as the function of the operating frequency parameter 76 and of the VSWR parameter 78 so that the first variable impedance substantially matches the port impedance at the fourth port 20.

In the second directivity mode, the control circuitry 34 is also configured to obtain the operating frequency parameter 76 that indicates the RF operating frequency. The control output 74 is generated and received by the directional coupler 12 so that the directional coupler 12 provides the directivity of the directional coupler 12 in the second signal direction D2 from the second port 16 to the first port 14 in response to the control output 74. The control output 74 is also generated so as to adjust the second variable impedance of the second variable impedance device 26 in the second directivity mode. In this manner, the control circuitry 34 is configured to set the first variable impedance as a function of the operating frequency parameter 76 so that the first variable impedance substantially matches the port impedance at the fifth port 22. Additionally, in the second directivity mode, the control circuitry 34 is also configured to obtain the VSWR parameter 78 that indicates the VSWR. The control circuitry 34 may generate the control output 74 so as to further set the second variable impedance in the second directivity mode as the function of the operating frequency parameter 76 and of the VSWR parameter 78 so that the second variable impedance substantially matches the port impedance at the fifth port 22. In this manner, by matching port impedances at the fourth port 20 in the first directivity mode and at the fifth port 22 in the second directivity mode, the control circuitry 34 is configured to maximize (and thereby increase) the directivity of the directional coupler 12.

Figure 2:
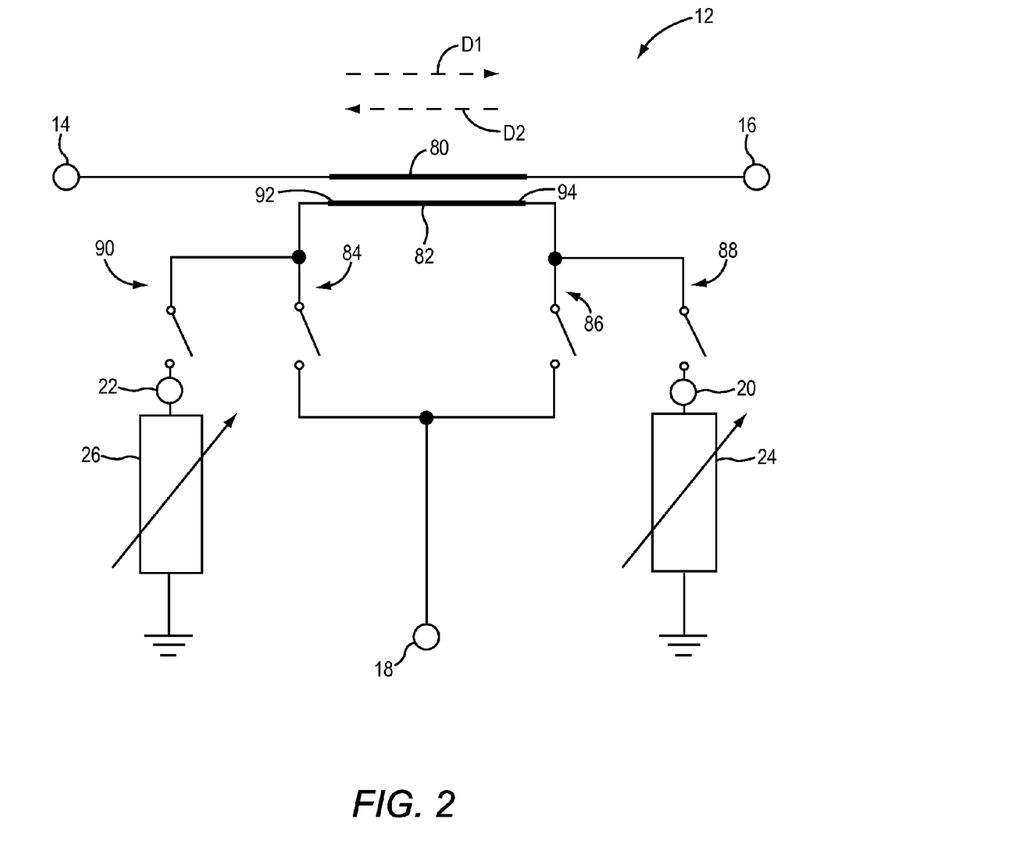
FIG. 2 illustrates an exemplary embodiment of the directional coupler illustrated in FIG. 1.

FIG. 2 illustrates one embodiment of the directional coupler 12 illustrated in FIG. 1. The directional coupler 12 shown in FIG. 2 includes the first port 14, the second port 16, the third port 18, the fourth port 20, the fifth port 22, the first variable impedance device 24 and the second variable impedance device 26, as described above with respect to FIG. 1. The directional coupler 12 further includes a first inductive element 80 coupled between the first port 14 and the second port 16. Additionally, the directional coupler 12 also includes a second inductive element 82 mutually coupled to the first inductive element 80. Note also that there is a capacitance is provided between the first inductive element 80 and the second inductive element 82, where the capacitance is provided such that the directional coupler 12 has the directivity as described above with respect to FIG. 1. The capacitance may be provided as a parasitic capacitance between the first inductive element 80 and the second inductive element 82. In other embodiments, the capacitance may be provided by one or more capacitive elements (not explicitly shown) that are connected between the first inductive element 80 and the second inductive element 82.

In order to switch the directivity of the directional coupler 12 between the first direction D1 and the second direction D2, the directional coupler 12 includes a first switchable conductive path 84, a second switchable conductive path 86, a third switchable conductive path 88, and a fourth switchable conductive path 90. The first switchable conductive path 84, the second switchable conductive path 86, the third switchable conductive path 88, and the fourth switchable conductive path 90 are each configured to be opened and closed. The first switchable conductive path 84 is coupled between a first location of the second inductive element 82 and the third port 18. In this embodiment, the first location of the second inductive element 82 is a first end 92 of the second inductive element 82. The second switchable conductive path 86 is coupled between a second location of the second inductive element 82 and the third port 18. In this embodiment, the second location of the second inductive element 82 is a second end 94 oppositely disposed with respect to the first end 92. It should be noted that in alternative embodiments, the first location and the second location of the second inductive element may be intermediary locations between the first end 92 and the second end 94. The third switchable conductive path 88 is coupled between the second end 94 of the second inductive element 82 and the fourth port 20. Additionally, the first variable impedance device 24 is coupled to the fourth port 20, as discussed above. Finally, the fourth switchable conductive path 90 is coupled between the first location of the second inductive element 82 and the fifth port 22. The second variable impedance device 26 is coupled to the fifth port 22, as discussed above.

Figure 3:
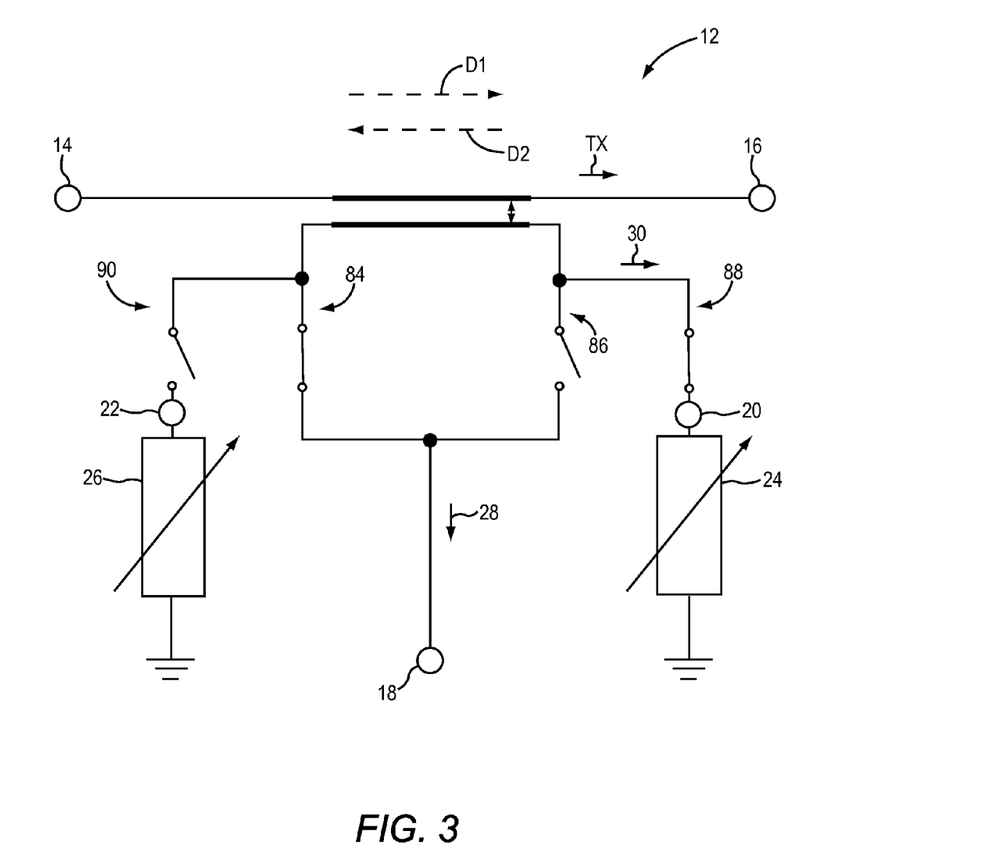
FIG. 3 illustrates the directional coupler shown in FIG. 2, as provided when the directivity of the directional coupler is provided in the first signal direction.

FIG. 3 illustrates one embodiment of the directional coupler 12, as provided when the directivity of the directional coupler 12 is provided in the direction D1. In this case, the control circuitry 34 (shown in FIG. 1) is provided in the first directivity mode. Thus, the RF transmission signal TX is allowed to pass from the first port 14 to the second port 16. In this case, the control circuitry 34 is configured to generate the control output 74 (shown in FIG. 1) so as to close the first switchable conductive path 84, open the second switchable conductive path 86, close the third switchable conductive path 88, and open the fourth switchable conductive path 90, as shown in FIG. 3. As such, the signal level of the coupled signal 28 is set in accordance with the power level of the RF transmission signal TX. The fifth port 22 is the deactivated isolation port, while the fourth port 20 is the activated isolation port.

As such, the control circuitry 34 (shown in FIG. 1) is configured to tune the first variable impedance of the first variable impedance device 24 in accordance with the operating frequency parameter 76 (shown in FIG. 1) and the VSWR parameter 78 (shown in FIG. 1) to provide matching. Since the operating frequency is provided through the operating frequency parameter 76, the first compensation signal 30 is generated by the directional coupler 12 from the fourth port 20 to compensate for the unwanted power reflections at the second port 16. This is done by programming the port impedance at the fourth port 20 as the function of the VSWR parameter 78, which indicates VSWR.

Figure 4:
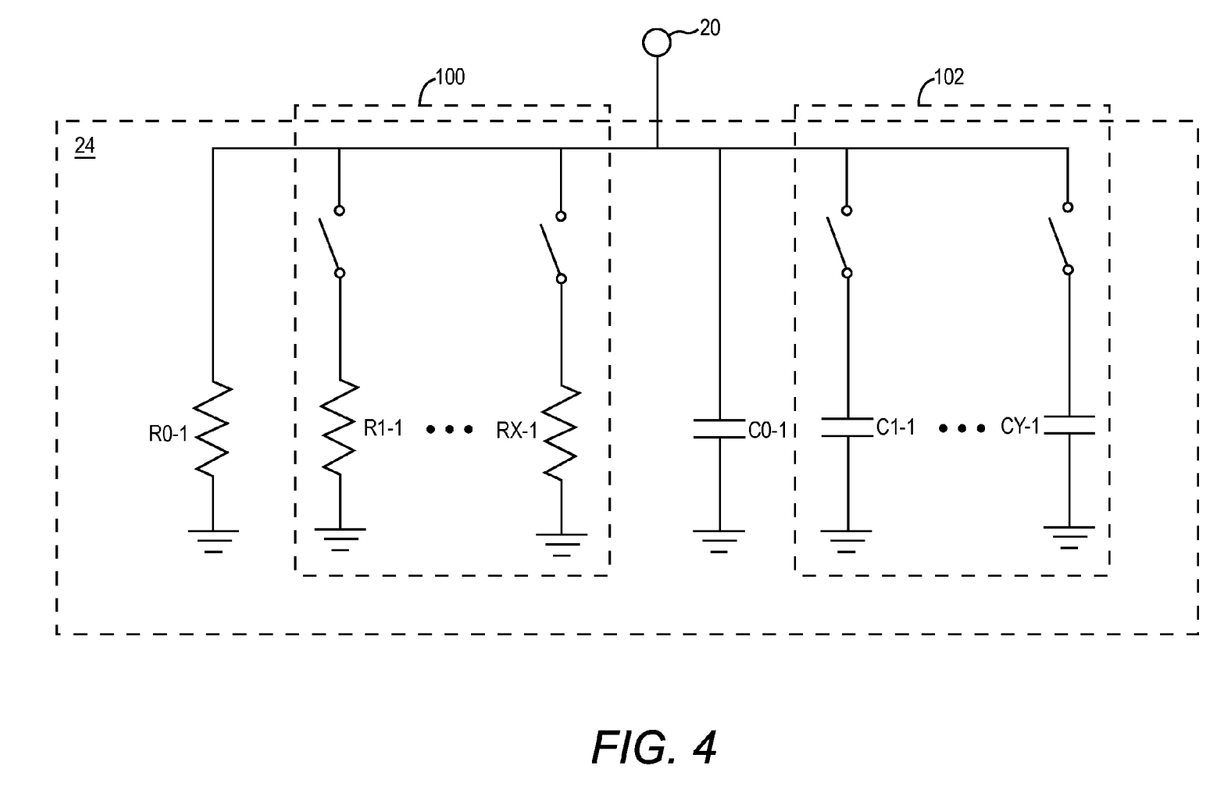
FIG. 4 illustrates an embodiment of a first variable impedance device 24 coupled to one of the isolation ports of the directional coupler shown in FIG. 2.

FIG. 4 illustrates one embodiment of the first variable impedance device 24 shown in FIG. 1. The first variable impedance device 24 includes a shunt resistor R0-1, a first variable resistive element 100, a shunt capacitor C0-1, and a first variable capacitive element 102. The first variable impedance device 24 is configured to vary a first variable resistance of the first variable impedance with the first variable resistive element 100. In this embodiment, the first variable resistive element 100 is a first programmable array of resistors R1-1 through RX-1, where the integer number X may be any integer number depending on a desired resistive granularity. Each of the resistors R1-1 through RX-1 is provided in a switchable shunt path. To set the first variable resistance of the first variable impedance device 24, the control circuitry 34 (shown in FIG. 1) generates the control output 74 so that a particular combination of the switchable paths with the resistors R1-1 through RX-1 is programmable so that the appropriate resistive value is presented at the fourth port 20.

Additionally, the first variable impedance device 24 is configured to vary a first variable reactance of the first variable impedance with the first variable capacitive element 102. In this embodiment, the first variable capacitive element 102 is a first programmable array of capacitors C1-1 through CY-1, where the integer number Y may be any integer number depending on a desired resistive granularity. Each of the resistors C1-1 through CY-1 is provided in a switchable shunt path. To set the first variable reactance of the first variable impedance device 24, the control circuitry 34 (shown in FIG. 1) generates the control output 74 so that a particular combination of the switchable paths with the capacitors C1-1 through CY-1 is programmable so that the appropriate reactance value is presented at the fourth port 20.

Figure 5:
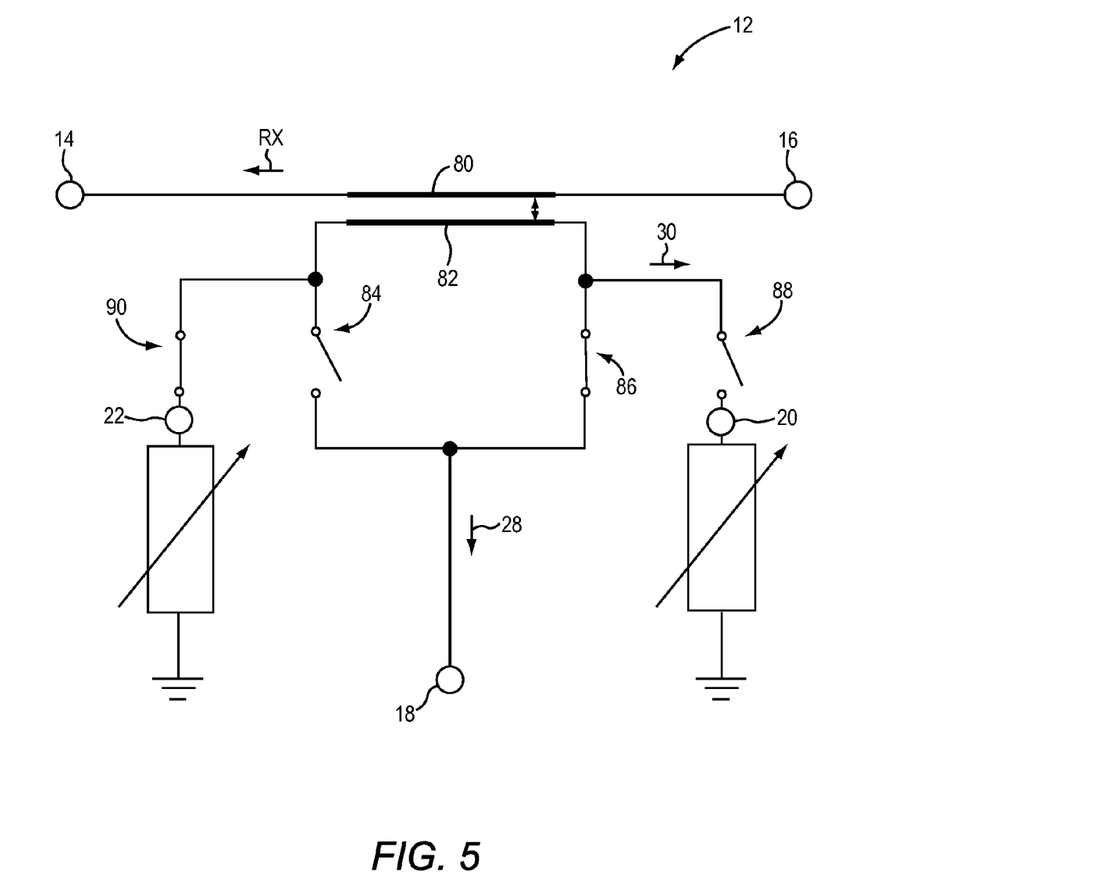
FIG. 5 illustrates the directional coupler shown in FIG. 2 as provided when the directivity of the directional coupler is provided in the second signal direction.

FIG. 5 illustrates one embodiment of the directional coupler 12, as provided when the directivity of the directional coupler 12 is provided in the direction D2. In this case, the control circuitry 34 (shown in FIG. 1) is provided in the second directivity mode. Thus, the RF receive signal RX is allowed to pass from the second port 16 to the first port 14. In this case, the control circuitry 34 is configured to generate the control output 74 (shown in FIG. 1) so as to open the first switchable conductive path 84, close the second switchable conductive path 86, open the third switchable conductive path 88, and close the fourth switchable conductive path 90, as shown in FIG. 5. As such, the signal level of the coupled signal 28 is set in accordance with the power level of the RF receive signal RX. The fourth port 20 is the deactivated isolation port, while the fifth port 22 is the activated isolation port.

As such, the control circuitry 34 (shown in FIG. 1) is configured to tune the second variable impedance of the second variable impedance device 26 in accordance with the operating frequency parameter 76 (shown in FIG. 1) and the VSWR parameter 78 (shown in FIG. 1) to provide matching. Since the operating frequency is provided through the operating frequency parameter 76, the second compensation signal 32 is generated by the directional coupler 12 from the fifth port 22 to compensate for the unwanted power reflections at the first port 14. This is done by programming the port impedance at the fourth port 20 as the function of the VSWR parameter 78, which indicates VSWR.

Figure 6:
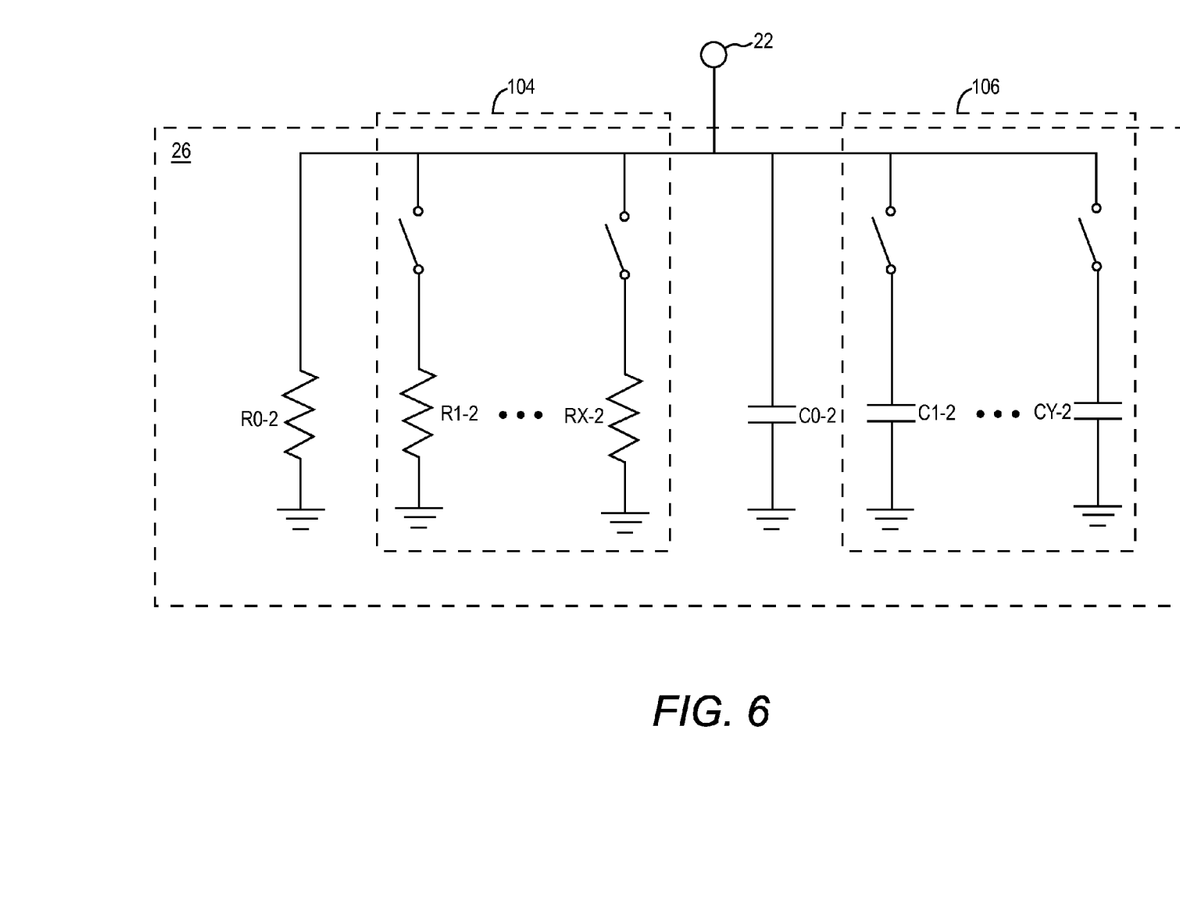
FIG. 6 illustrates an embodiment of a second variable impedance device coupled to another one of the isolation ports of the directional coupler shown in FIG. 2.

FIG. 6 illustrates one embodiment of the second variable impedance device 26 shown in FIG. 1. The second variable impedance device 26 includes a shunt resistor R0-2, a second variable resistive element 104, a shunt capacitor C0-2, and a second variable capacitive element 106. The second variable impedance device 26 is configured to vary a second variable resistance of the second variable impedance with the second variable resistive element 104. In this embodiment, the second variable resistive element 104 is a first programmable array of resistors R1-2 through RX-2, where the integer number X may be any integer number depending on a desired resistive granularity. Each of the resistors R1-2 through RX-2 is provided in a switchable shunt path. To set the second variable resistance of the second variable impedance device 26, the control circuitry 34 (shown in FIG. 1) generates the control output 74 so that a particular combination of the switchable paths with the resistors R1-2 through RX-2 is programmable so that the appropriate resistive value is presented at the fifth port 22.

Additionally, the second variable impedance device 26 is configured to vary a second variable reactance of the second variable impedance with the second variable capacitive element 106. In this embodiment, the second variable capacitive element 106 is a first programmable array of capacitors C1-2 through CY-2, where the integer number Y may be any integer number depending on a desired resistive granularity. Each of the resistors C1-2 through CY-2 is provided in a switchable shunt path. To set the second variable reactance of the second variable impedance device 26, the control circuitry 34 (shown in FIG. 1) generates the control output 74 so that a particular combination of the switchable paths with the capacitors C1-2 through CY-2 is programmable so that the appropriate reactance value is presented at the fifth port 22.

Figure 7:
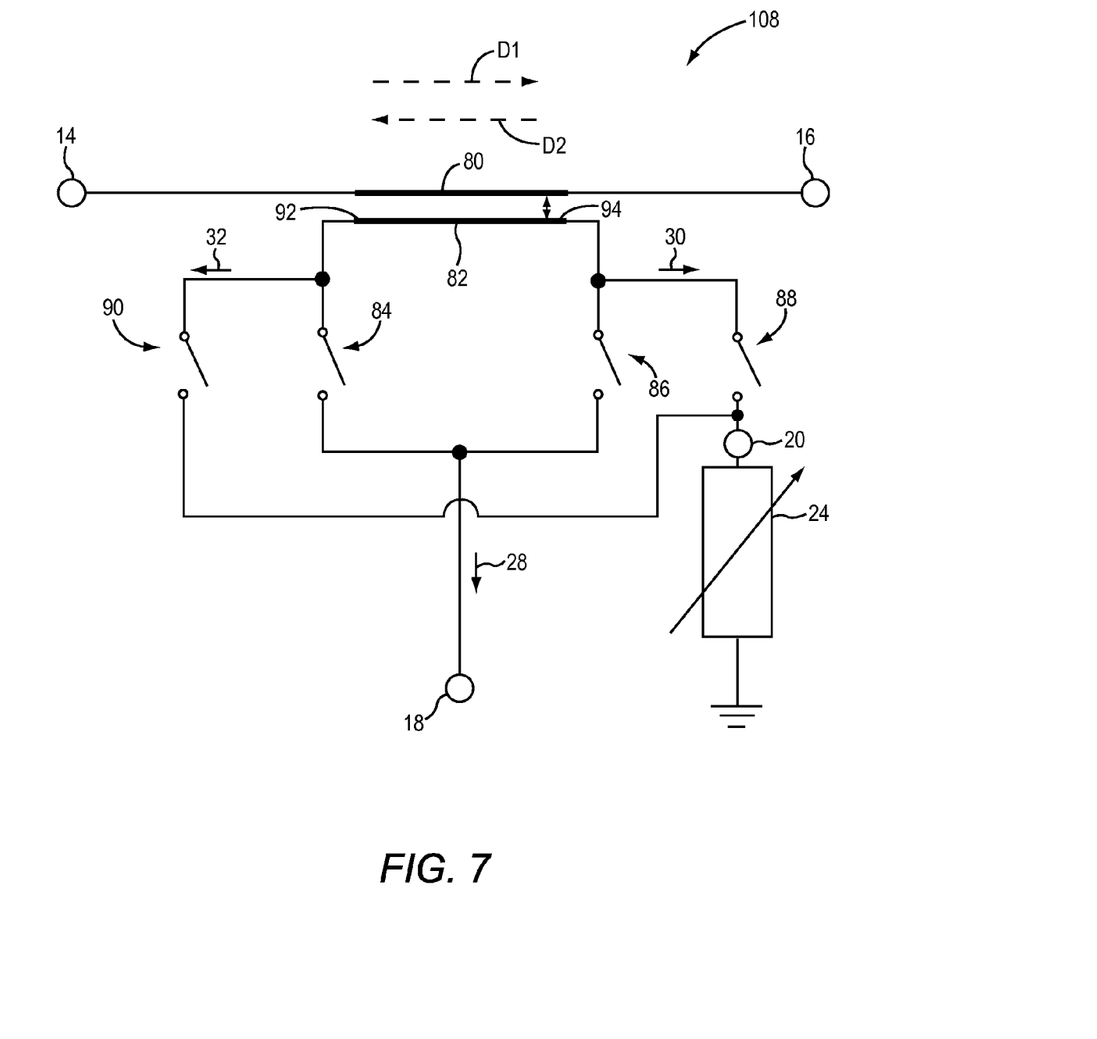
FIG. 7 illustrates another embodiment of a directional coupler in accordance with this disclosure.

FIG. 7 illustrates another embodiment of a directional coupler 108. The directional coupler 108 is the same as the directional coupler 12 shown in FIGS. 1, 2, 3, and 5, except that in this embodiment, the directional coupler 108 does not include the fifth port 22 (shown in FIG. 1), and the fourth switchable conductive path 90 is connected between the first end 92 and the fourth port 20. Otherwise, the directional coupler 108 shown in FIG. 7 is the same as the directional coupler 12 shown in FIGS. 1, 2, 3, and 5. Furthermore, the control circuitry 34 (shown in FIG. 1) operates the directional coupler 108 in the same manner described above with respect to the first directivity mode and the second directivity mode, except that in this embodiment, the fourth port 20 is always the deactivated isolation port. Thus, the control circuitry 34 adjusts the first variable impedance of the first variable impedance device 24 in both the first directivity mode and the second directivity mode in order to provide impedance matching at the fourth port 20. The embodiment shown in FIG. 7 is advantageous when area consumption needs to be as small as possible since the second variable impedance device 26 (shown in FIG. 1 is not needed.)

Those skilled in the art will recognize improvements and modifications to the preferred embodiments of the present disclosure. All such improvements and modifications are considered within the scope of the concepts disclosed herein and the claims that follow.

What is claimed is:

1. A directional coupler, comprising:
   a first port;
   a second port;
   a third port;
   a fourth port;
   a first inductive element coupled between the first port and the second port;
   a second inductive element mutually coupled to the first inductive element;
   a first switchable conductive path configured to be opened and closed, wherein the first switchable conductive path is coupled between a first location of the second inductive element and the third port;
   a second switchable conductive path configured to be opened and closed, wherein the second switchable conductive path is coupled between a second location of the second inductive element and the third port;
   a third switchable conductive path configured to be opened and closed; and
   a first variable impedance device configured to provide a first variable impedance wherein:
      the third switchable conductive path is coupled between the second location of the second inductive element and the fourth port; and
      the first variable impedance device is coupled to the fourth port.

2. The directional coupler of claim 1 wherein:
   the second inductive element includes a first end and a second end oppositely disposed with respect to the first end;
   the first location of the second inductive element is the first end of the second inductive element; and
   the second location of the second inductive element is the second end of the second inductive element.

3. The directional coupler of claim 1 wherein the first variable impedance device comprises:
   a first variable resistive element configured to vary a first variable resistance of the first variable impedance; and
   a first variable capacitive element configured to vary a first variable reactance of the first variable impedance.

4. The directional coupler of claim 3 wherein:
   the first variable resistive element comprises a first programmable array of resistors; and
   the first variable capacitive element comprises a first programmable array of capacitors.

5. The directional coupler of claim 1 further comprising a fifth port, a fourth switchable conductive path configured to be opened and closed, and a second variable impedance device configured to provide a second variable impedance wherein:
   the fourth switchable conductive path is coupled between the first location of the second inductive element and the fifth port; and
   the second variable impedance device is coupled to the fifth port.

6. The directional coupler of claim 5 wherein:
   the first variable impedance device comprises:
      a first variable resistive element configured to vary a first variable resistance of the first variable impedance;
      a first variable capacitive element configured to vary a first variable reactance of the first variable impedance;
   the second variable impedance device comprises:
      a second variable resistive element configured to vary a second variable resistance of the second variable impedance; and a second variable capacitive element configured to vary a second variable reactance of the second variable impedance.

7. The directional coupler of claim 6 wherein:
the first variable resistive element comprises a first programmable array of resistors;
the first variable capacitive element comprises a first programmable array of capacitors;
the second variable resistive element comprises a second programmable array of resistors; and
the second variable capacitive element comprises a second programmable array of capacitors.

8. The directional coupler of claim 1 wherein the first variable impedance device comprises:
a first variable resistive element configured to vary a first variable resistance of the first variable impedance; and
a first variable capacitive element configured to vary a first variable reactance of the first variable impedance.

9. The directional coupler of claim 8 wherein:
the first variable resistive element comprises a first programmable array of resistors; and
the first variable capacitive element comprises a first programmable array of capacitors.

10. Radio frequency (RF) front end circuitry comprising:
a directional coupler, comprising:
a first port;
a second port;
a third port;
a fourth port;
a first inductive element coupled between the first port and the second port;
a second inductive element mutually coupled to the first inductive element;
a first switchable conductive path configured to be opened and closed, wherein the first switchable conductive path is coupled between a first location of the second inductive element and the third port;
a second switchable conductive path configured to be opened and closed, wherein the second switchable conductive path is coupled between a second location of the second inductive element and the third port;
a third switchable conductive path configured to be opened and closed; and
a first variable impedance device configured to provide a first variable impedance wherein:
the third switchable conductive path is coupled between the second location of the second inductive element and the fourth port; and
the first variable impedance device is coupled to the fourth port; and
control circuitry operable in a first directivity mode and a second directivity mode, wherein the control circuitry is configured to:
close the first switchable conductive path in the first directivity mode;
open the second switchable conductive path in the first directivity mode;
close the second switchable conductive path in the second directivity mode; and
open the first switchable conductive path in the second directivity mode.

11. The RF front end circuitry of claim 10 wherein the directional coupler has a directivity and the directional coupler is configured to:
provide the directivity in a first signal direction from the first port to the second port when the first switchable conductive path is closed and the second switchable conductive path is opened; and
provide the directivity in a second signal direction from the second port to the first port when the first switchable conductive path is opened and the second switchable conductive path is closed.

12. The RF front end circuitry of claim 11 wherein:
the second inductive element includes a first end and a second end oppositely disposed with respect to the first end;
the first location of the second inductive element is the first end of the second inductive element; and
the second location of the second inductive element is the second end of the second inductive element.

13. The RF front end circuitry of claim 11 wherein the first directivity mode is a forward power directivity mode and the second directivity mode is a reverse power directivity mode.

14. The RF front end circuitry of claim 11 wherein the directional coupler further comprises a fifth port, a fourth switchable conductive path configured to be opened and closed, and a second variable impedance device configured to provide a second variable impedance wherein:
the fourth switchable conductive path is coupled between the first location of the second inductive element and the fifth port; and
the second variable impedance device is coupled to the fifth port.

15. The RF front end circuitry of claim 14 wherein the control circuitry is further configured to:
close the third switchable conductive path in the first directivity mode;
open the fourth switchable conductive path in the first directivity mode;
close the fourth switchable conductive path in the second directivity mode; and
open the third switchable conductive path in the second directivity mode.

16. The RF front end circuitry of claim 15 wherein the control circuitry is further configured to:
adjust the first variable impedance of the first variable impedance device in the first directivity mode so as to increase the directivity of the directional coupler in the first signal direction; and
adjust the second variable impedance of the second variable impedance device in the second directivity mode so as to increase the directivity of the directional coupler in the second signal direction.

17. The RF front end circuitry of claim 16 wherein the control circuitry is further configured to:
obtain an operating frequency parameter than indicates an RF operating frequency;
adjust the first variable impedance of the first variable impedance device in the first directivity mode by being configured to set the first variable impedance as a function of the operating frequency parameter so that the first variable impedance substantially matches a first port impedance at the fourth port; and
adjust the second variable impedance of the second variable impedance device in the second directivity mode by being configured to set the second variable impedance as a function of the operating frequency parameter so that the second variable impedance substantially matches a second port impedance at the fifth port.

18. The RF front end circuitry of claim 17 wherein the control circuitry is further configured to:
obtain a Voltage Standing Wave Ratio (VSWR) VSWR parameter that indicates a VSWR;

set the first variable impedance in the first directivity mode as the function of the operating frequency parameter and of the VSWR parameter so that the first variable impedance substantially matches the first port impedance at the fourth port; and set the second variable impedance in the second directivity mode as the function of the operating frequency parameter and of the VSWR parameter so that the second variable impedance substantially matches the second port impedance at the fifth port.

* * * * *

UNITED STATES PATENT AND TRADEMARK OFFICE
CERTIFICATE OF CORRECTION

PATENT NO. : 9,799,444 B2  
APPLICATION NO. : 14/840216  
DATED : October 24, 2017  
INVENTOR(S) : Marcus Granger-Jones et al.

Page 1 of 1

It is certified that error appears in the above-identified patent and that said Letters Patent is hereby corrected as shown below:

In the Claims

In Column 14, Line 66, replace "Voltage Standing Wave Ratio (VSWR) VSWR" with --Voltage Standing Wave Ratio (VSWR)--.

Signed and Sealed this
Twelfth Day of December, 2017

Joseph Matal
*Performing the Functions and Duties of the*
*Under Secretary of Commerce for Intellectual Property and*
*Director of the United States Patent and Trademark Office*